(12) United States Patent
Lerner

(10) Patent No.: US 8,278,183 B2
(45) Date of Patent: Oct. 2, 2012

(54) PRODUCTION OF ISOLATION TRENCHES WITH DIFFERENT SIDEWALL DOPINGS

(75) Inventor: Ralf Lerner, Erfurt (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 0 days.

(21) Appl. No.: 12/670,771

(22) PCT Filed: Jul. 25, 2008

(86) PCT No.: PCT/EP2008/059834
§ 371 (c)(1),
(2), (4) Date: Jul. 6, 2010

(87) PCT Pub. No.: WO2009/016134
PCT Pub. Date: Feb. 5, 2009

(65) Prior Publication Data
US 2011/0143519 A1    Jun. 16, 2011

(30) Foreign Application Priority Data
Jul. 27, 2007 (DE) .......................... 10 2007 035 251

(51) Int. Cl.
*H01L 21/76* (2006.01)
(52) U.S. Cl. ......... 438/427; 438/424; 438/433; 438/434
(58) Field of Classification Search .................. 438/424, 438/427, 433, 434
See application file for complete search history.

(56) References Cited

U.S. PATENT DOCUMENTS

| 4,491,486 A | 1/1985 | Iwai |
| 4,676,847 A | 6/1987 | Lin |
| 4,756,793 A | 7/1988 | Peek |

(Continued)

FOREIGN PATENT DOCUMENTS

DE    10 2005 010 944    9/2006

(Continued)

OTHER PUBLICATIONS

International Search Report for PCT/EP2008/059835 mailed Dec. 4, 2008; 3 pages.

(Continued)

*Primary Examiner* — Jarrett Stark
*Assistant Examiner* — John M Parker
(74) *Attorney, Agent, or Firm* — Hunton & Williams LLP

(57) ABSTRACT

A description is given of a method for producing isolation trenches (32, 34) with different sidewall dopings on a silicon-based substrate wafer for use in the trench-isolated smart power technology. In this case, a first trench (32) having a first width and a second trench (34) having a second width which is greater than the first width are formed using a hard mask (30). The sidewalls of the first and second trenches are doped in accordance with a first doping type in order to produce sidewalls having a first doping. A material layer (50, 51, 60, 61) is deposited with a thickness determined so as to fill the first trench (32) completely up to and beyond the hard mask and to maintain the gap (34*a*) in the second trench (34). By means of isotropic etching the material layer is removed from the second trench, but residual material of the material layer is maintained in the first trench. A further doping of sidewalls of the first trench or of the second trench in the presence of the residual material is then performed.

16 Claims, 5 Drawing Sheets

U.S. PATENT DOCUMENTS

| | | | |
|---|---|---|---|
| 5,013,673 | A | 5/1991 | Fuse |
| 5,047,359 | A | 9/1991 | Nagatomo |
| 5,057,443 | A | 10/1991 | Hutter |
| 5,241,210 | A | 8/1993 | Nakagawa et al. |
| 5,283,461 | A | 2/1994 | Beasom |
| 5,734,192 | A | 3/1998 | Sengle et al. |
| 6,294,451 | B1 * | 9/2001 | Yoshizawa .................... 438/597 |
| 6,394,638 | B1 | 5/2002 | Sengle et al. |
| 6,486,039 | B2 | 11/2002 | Yoo et al. |
| 6,509,240 | B2 | 1/2003 | Ren et al. |
| 6,808,987 | B2 | 10/2004 | Hsiao et al. |
| 6,833,305 | B2 | 12/2004 | Mandelman et al. |
| 6,929,998 | B2 | 8/2005 | Chen et al. |
| 7,029,997 | B2 | 4/2006 | Wu |
| 7,112,505 | B2 | 9/2006 | Wu |
| 7,833,862 | B2 * | 11/2010 | Blank et al. .................... 438/270 |
| 2008/0283960 | A1 | 11/2008 | Lerner |
| 2009/0072355 | A1 * | 3/2009 | Cheng et al. .................. 257/622 |

FOREIGN PATENT DOCUMENTS

| | | |
|---|---|---|
| WO | WO 01/91179 | 11/2001 |

OTHER PUBLICATIONS

PCT International Preliminary Report on Patentability (PCT/IB/373) for International Appln. No. PCT/EP2008/059835); Issued Feb. 9, 2010; 1 page.

PCT Written Opinion of the International Searching Authority (PCT/ISA/237) for International Appln. No. PCT/EP2008/059835); Issued Feb. 9, 2010; 9 pages.

* cited by examiner

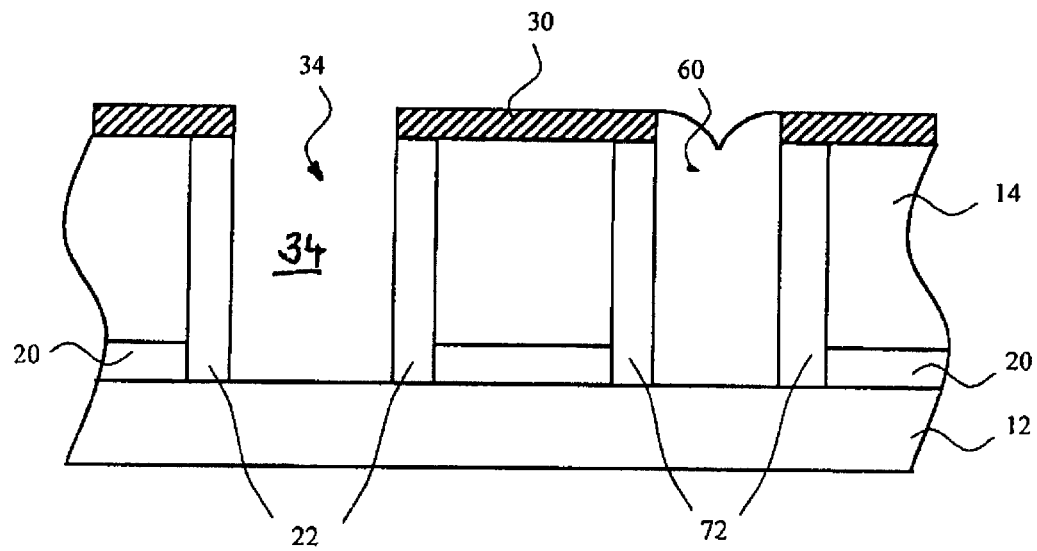
Fig. 7
Fig. 8
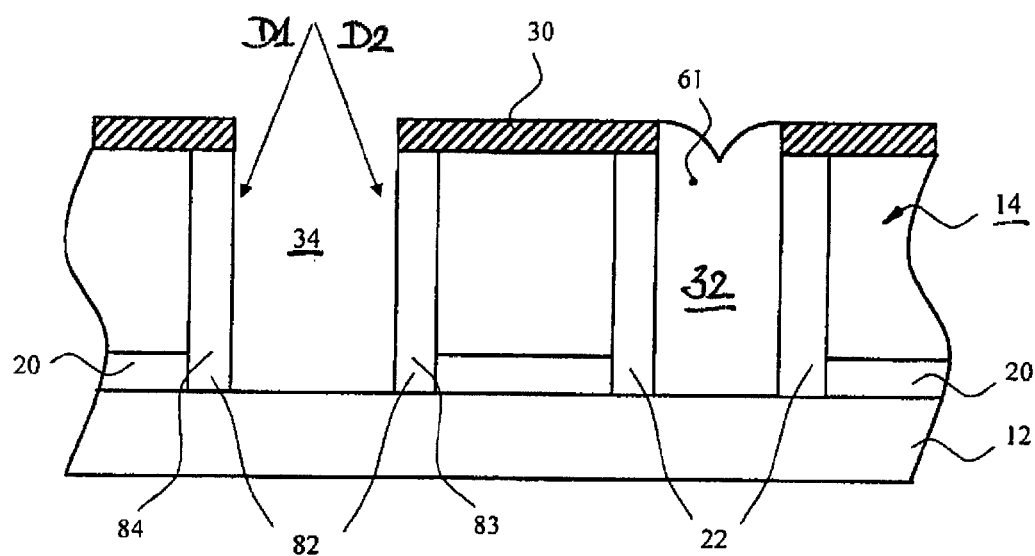

PRODUCTION OF ISOLATION TRENCHES WITH DIFFERENT SIDEWALL DOPINGS

CROSS-REFERENCE TO RELATED APPLICATIONS

The application is a U.S. National Stage Application of International Application of PCT/EP2008/059835 filed Jul. 25, 2008, which claims the benefit of German Patent Application No. 10 2007 0325 251.6 filed Jul. 27, 2007, the disclosures of which are herein incorporated by reference in their entireties.

FIELD OF THE DISCLOSURE OF INVENTION

The invention relates to isolation trenches and the production of such isolation trenches having differently doped trench sidewalls.

BACKGROUND OF THE INVENTION

Isolation trenches are used in SOI silicon wafers for isolating different components (e.g. transistors) in smart power ICs or entire areas having different potentials. In this case the isolation trench can encompass the component to be isolated or the area to be isolated in circular shape, cf. in this respect U.S. Pat. No. 5,734,192 or U.S. Pat. No. 6,394,638 B1.

U.S. Pat. No. 5,283,461 describes a trench configuration wherein the components to be isolated are separated by a grid of isolation trenches. For a variety of applications it is advantageous to dope the trench sidewalls. The sidewall doping can be effected for example by depositing a doped layer followed by a subsequent annealing step in which the doping atoms are diffused from the doped layer into the trench sidewalls. This is described in U.S. Pat. No. 4,676,847. It is a characterizing feature of this method that all trench sidewalls in all trenches receive the same doping.

Also doping the trench sidewalls by means of ion implantation effected at a proper angle, as described in U.S. Pat. Nos. 5,013,673, 5,047,359 and 6,509,240, produces a uniform doping of all trench sidewalls.

FIG. 1 illustrates the state of the art and shows a schematic cross section of a silicon on insulator (SOI) silicon wafer consisting of a substrate wafer 10, a buried isolating layer 12, typically made of $SiO_2$, and an active layer 14. The isolation trench 16 consists of an isolating layer 17 and a fill layer 18.

FIG. 2 shows the structure with a buried doped layer 20 at the bottom of the active layer 14 and with a sidewall doping 22, i.e. a doping of the silicon end faces bordering the trench.

Different methods and procedures are known for differently doping the sidewalls of isolation trenches by means of diffusion.

U.S. Pat. No. 5,057,443 discloses a method wherein at first a wide recess is produced by anisotropic etching. The bottom and the two sidewalls are doped by means of gas phase doping. By means of conformal deposition of an isolating layer (e.g. silicon dioxide) the bottom and the sidewalls of the wide recess are lined. The isolating layer on the bottom of the recess is subsequently etched off with the isolating layer remaining on the sidewalls. The recess is filled again with single crystal silicon with a certain doping by means of selective epitaxy. As a result isolation trenches made of isolating material (remaining isolating layer on the sidewalls) are obtained, wherein the adjacent silicon can be doped on the one side (sidewalls of the wide recess) differently from the other side (silicon layer produced by epitaxy). However, this method will not be effective in SOI wafers since there the buried oxide cannot be used as a nucleus for epitaxial growth. It is also impossible to produce isolation trenches each having the same doping on both sides (i.e. the left and the right trench sidewall).

U.S. Pat. No. 4,756,793 describes a method which allows producing isolation trenches having different sidewall dopings. However, the method described requires a complex filling of the trenches with a fill layer, covering of a part of the trenches with a second masking layer, removing the fill layer in the open portions of the masking layer, and doping the sidewalls by implantation performed at a certain angle. By repeating the described method isolation trenches could be produced which have n-conductive sidewalls on the left and right side (or front and back side, respectively), as well as isolation trenches which are surrounded by p-conductive sidewalls on all sides. The necessity of filling and opening the trenches several times causes extensive costs and is a severe disadvantage when deep isolation trenches (with a high aspect ratio) are to be produced, since the trenches have to be filled and etched open several times.

Methods producing isolation trenches having different sidewall doping in vertical direction are described in U.S. Pat. No. 7,112,505 B2 (here with oxygen implantation which can of course be used for doping on principle), in U.S. Pat. No. 6,929,998 B2, in U.S. Pat. No. 6,808,987 B2 and in U.S. Pat. No. 6,833,305 B2. It is a common feature of all methods that they also produce isolation trenches which have different sidewall dopings only in a vertical direction (in a direction from the surface to the bottom). However, all the isolation trenches on the wafer are identical.

Another method for producing different isolation trenches is described in U.S. Pat. No. 6,486,039 B2. Here isolating layers of different thickness are produced by means of an additional masking layer (photomask or oxide hard mask). In principle the described method could be used for producing different sidewall dopings. However, there remains the disadvantage that in addition to the photo mask for producing the isolation trenches an additional mask for producing the different doping regions is necessary. Furthermore, the described method in this simple form can be used only for flat isolation trenches (with a low aspect ratio). For deeper trenches there is a problem with exposing, developing and removing the photoresist in the deep trenches.

Also the method described in U.S. Pat. No. 7,029,997 B2 uses a second masking layer for masking of portion of the isolation trenches before implantation. Similar to the method described above, such a method can be used only for relatively flat trenches. In isolation trenches with a high aspect ratio the use of an additional photo mask is problematic because the masking layer has to be removed reliably also from the depths of the trenches.

From DE 10 2005 010 944 a method is known using the varying width of isolation trenches for producing a masking layer for an additional etching step without a second photo mask. In this case a narrow trench is completely filled while a wider trench remains partially open and thus can be used as a mask for an etching step.

SUMMARY OF THE INVENTION

It is the object of the invention to provide a method for producing isolation trenches having different trench sidewall dopings on the very same substrate material, for example bulk or SOI silicon wafer, using only one trench structuring (with a single photo mask and one trench etching).

The object is achieved by a method for producing isolation trenches having different sidewall dopings on a silicon-based substrate wafer for the use in a trench-isolated smart power technology. (claim 1). The method comprises forming a first trench having a first width and a second trench having a second width which is larger than the first width using a hard mask. Subsequently the sidewalls of the first and the second trench are doped according to a first doping type. In doing so, sidewalls with a first doping are produced. Thereafter a material layer is deposited having a thickness which is selected such that the first trench is filled completely up to and beyond the hard mask and that a gap remains in the second trench. The material layer is removed from the second trench by isotropic etching and a residue of the material layer is kept in the first trench. Another doping of the sidewalls of the second trench is performed.

By providing trenches with a different width, different depositing conditions can thus be provided leading to a complete filling of the "narrow" trench while at least a gap is maintained in the "wide" trench. The gap can be achieved by a substantially conformal depositing behavior under which the wide trench is lined so that a layer with a desired thickness is formed on the exposed surfaces, i.e. the sidewalls and the bottom, without the layers being joined to form a continuous filling or closing the entrance of the wide trench.

The difference of the width of the trenches depends on technology and may vary in a range of about 500 nm up to several μm. The width of the narrow trench can be selected according to component requirements, for example of the required isolation strength or such, and it can be in the range of several hundred nm. The width of the wide trench can be selected accordingly in such a way that the isolating effect is met, on the one hand, while the desired behavior during depositing the material layer is reached, on the other hand. This means completely filling the "narrow trench" and "lining" the "wide trench".

The width of the second trench (claim 1) is selected such that a difference within the above-described meaning is provided. Therefore the terms "narrow" and "wide" are to be understood related to technology in the following description and are used herein in the sense of achieving a differing depositing result in the trench. The terms can also be simply understood such that one of the trenches is wider than the other (claim 15, claim 12). These two types of trenches are adjacent.

The layer in the wide trench can be removed efficiently by etching, due to the etching attack also inside the wide trench, while the complete filling of the narrow trench up to and beyond the hard mask leaves sufficient material that at least the sidewalls of the narrow trench remain covered. By providing the residual material and the hard mask, an effective mask pattern is made available which protects the wafer surface and selectively permits access to the covered sidewalls of the narrow trench or the exposed sidewalls of the wide trench for further doping without requiring additional structuring measures or complicated process steps.

The purpose of the invention is the simplified, cost-effective production of isolation trenches comprising different sidewall dopings on a chip in a sense that trenches having n-conductive sidewall dopings and trenches having p-conductive sidewall dopings are created, or a combination of one of these trenches with another one having differently doped sidewalls.

Further solutions for this purpose can be found in claims 12 to 16, also as a product which is produced by a method (claim 16).

Trenches with n-conductive sidewalls and trenches with p-conductive sidewalls can be produced or trenches with a high or low doping concentration, respectively, as well as combinations with trenches having differently doped sidewalls. Applications can be found for example in trench-isolated smart power technologies in silicon on insulator (SOI) silicon wafers wherein the isolation trench is used as an isolating element and at the same time the trench sidewall is used as a conductor region for buried layers which are differently doped.

As a connection to a buried n-doped layer an $n^+$ sidewall doping would be used, for example. Doped sidewalls with a p doping could be used as emitters in lateral IGBTs.

The described isolation trenches comprising different sidewall dopings could also be used in pn-isolated processes for connecting n-doped and p-doped buried layers, for example.

In another embodiment the material layer is deposited as a doping layer, and performing another doping of sidewalls of the first trench or the second trench in the presence of the residual material includes performing of annealing for the formation of the second doping in the sidewalls of the first trench.

In this way the material layer is used as an efficient donor material for the desired type of doping substance.

In another embodiment the material layer is deposited as a diffusion barrier layer, and performing another doping of sidewalls of the first trench or the second trench in the presence of the residual material includes performing another doping for producing doped sidewalls in the second trench differing with respect to doping from the sidewalls of the first trench.

In another embodiment performing another doping of sidewalls of the first trench or the second trench in the presence of the residual material includes performing ion implantation for producing first doped sidewalls and/or second doped sidewalls in the second trench differing with respect to doping from the sidewalls of the first trench, wherein the residual material is used as an implantation mask.

The method according to the invention can be applied efficiently on SOI structures and bulk structures in which buried doped layers having different conductivity types are contacted through the trench sidewalls, as it is also described in the dependent claims.

Furthermore, additional embodiments will be apparent from the dependent claims and the description of examples.

According to the invention it is thus possible to differently dope isolation trench sidewalls of multiple trenches on a process wafer using only a single photo mask. In doing so, n- or p-conductive doping regions comprising different concentrations of doping substances can be realized.

BRIEF DESCRIPTION OF THE DRAWINGS

The invention will be explained and supplemented with reference to exemplary embodiments with two semiconductor wafers and referring to the drawing.

FIG. 3 to FIG. 7 show steps according to an example of the production of differently doped sidewalls of different isolation trenches on a chip based on SOI technology according to the invention;

FIG. 8 shows a variation of doping of a wide trench 34 in SOI technology;

DETAILED DESCRIPTION OF EXEMPLARY EMBODIMENTS

Figure 1:
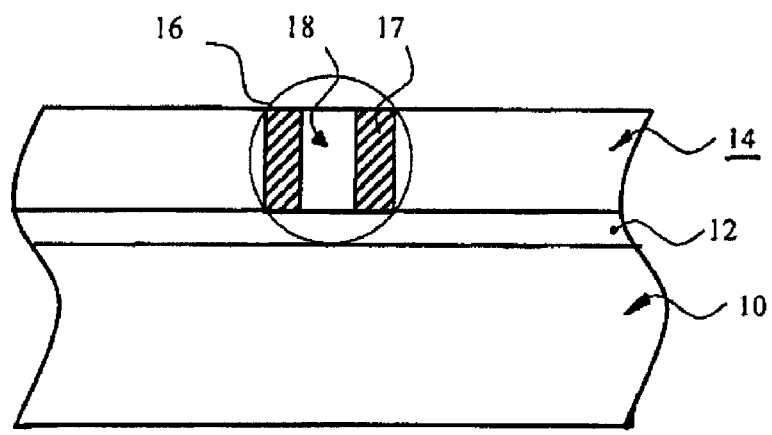
FIG. 1 shows a typical known isolation trench in SOI technology without sidewall doping.
Figure 2:
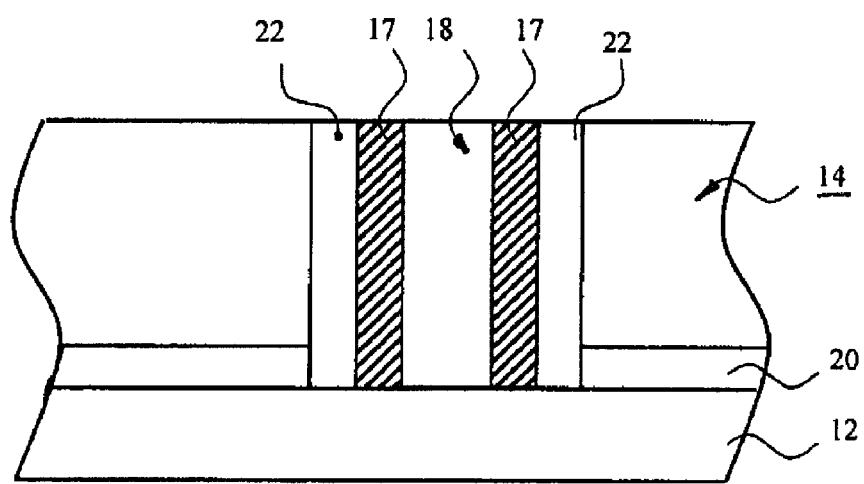
FIG. 2 shows a known isolation trench with sidewall doping and a buried doped layer 20 in SOI technology.

In the following description, further reference is made to FIGS. 1 and 2 showing the state of the art which were explained in the introductory part. The reference numerals used therein will also be used in the remaining part of the document.

Figure 3:
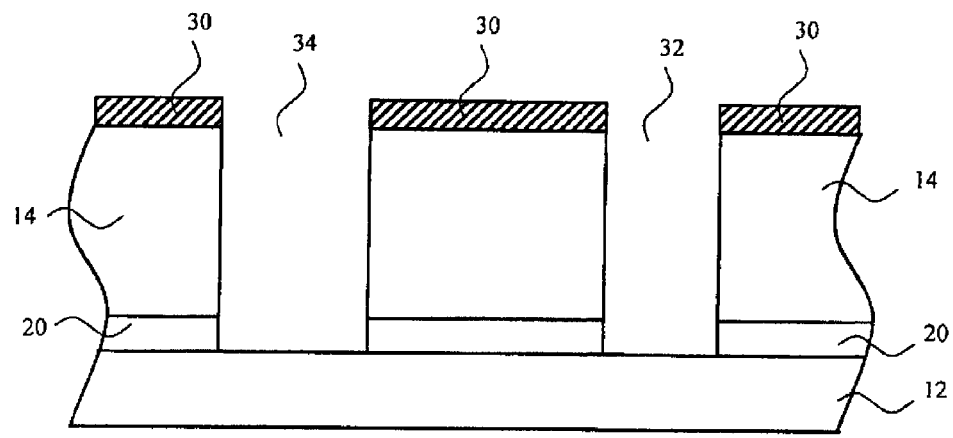

FIG. 3 shows a cross-sectional view of a buried oxide layer 12 with the buried "doped layer" 20 arranged on top of it, as it was explained with reference to FIGS. 1 and 2. A hard mask 30, for example made of silicon dioxide or silicon nitride, is structured at first by means of a photo mask and etching. As can be seen in the figure, the hard mask 30 is used to etch narrow isolation trenches 32 and wide isolation trenches 34. The terms "narrow" and "wide" are to be understood in the meaning defined above.

In doing so, etching is performed down to the buried isolating layer 12, i.e. etching is performed also through the buried doped silicon layer 20.

Figure 4:
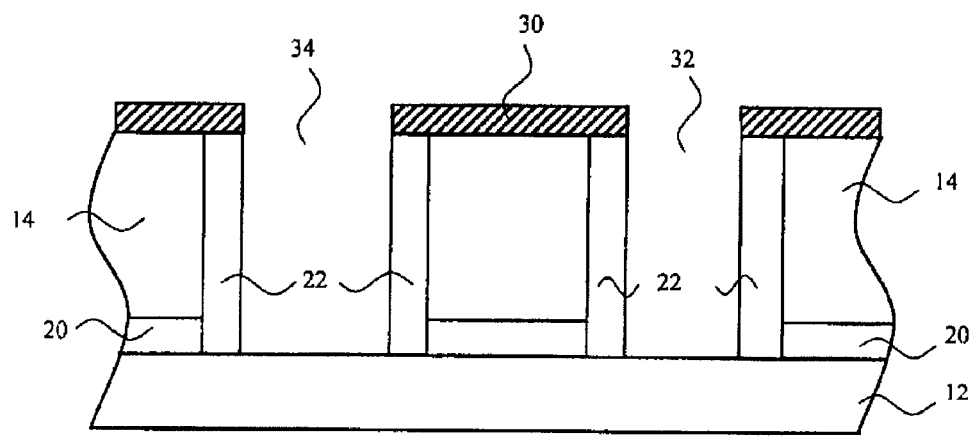

FIG. 4 shows the state of processing after the first sidewall doping has been performed. This first sidewall doping 22 can be effected by means of one of the methods mentioned above, for example, i.e. by means of ion implantation performed at a defined angle, for example, or by means of doping from the doped layer, whereafter this doped layer is removed. The hard mask 30 prevents doping of the surface.

Figure 5:
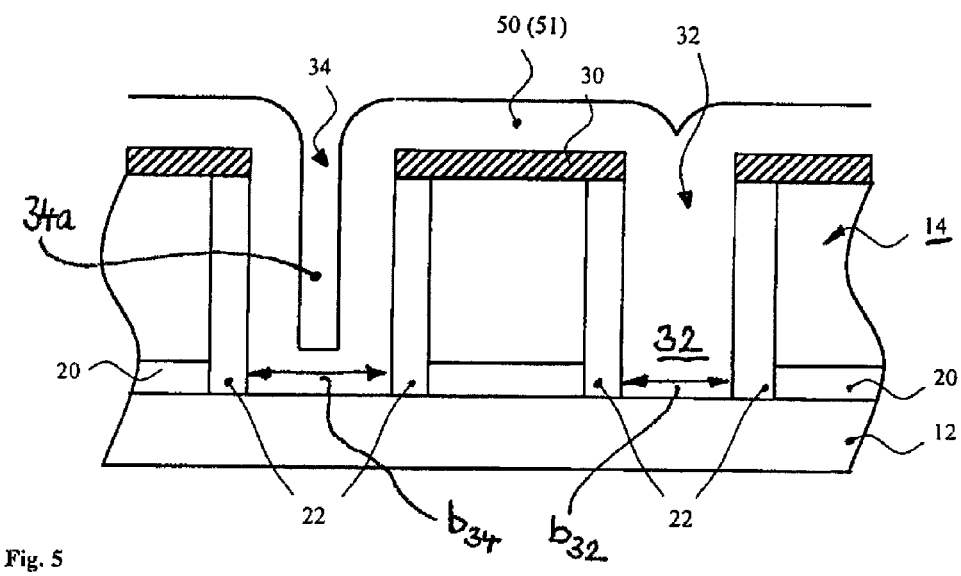

FIG. 5 shows the state of depositing a material layer 50 which is intended as a base for a further doping of one of the trenches 32 or 34. In the embodiment shown the material layer 50 is provided as doped layer 50. In this case the layer 50 is deposited with such a thickness that the narrow isolation trench 32 is completely filled over its width $b_{32}$, whereas the wide isolation trench 34 is not completely filled over its width $b_{34}$. A gap 34a extending from the surface into the depth remains open in the wide isolation trench 34. The width of the gap is smaller than the width $b_{34}$.

Figure 6:
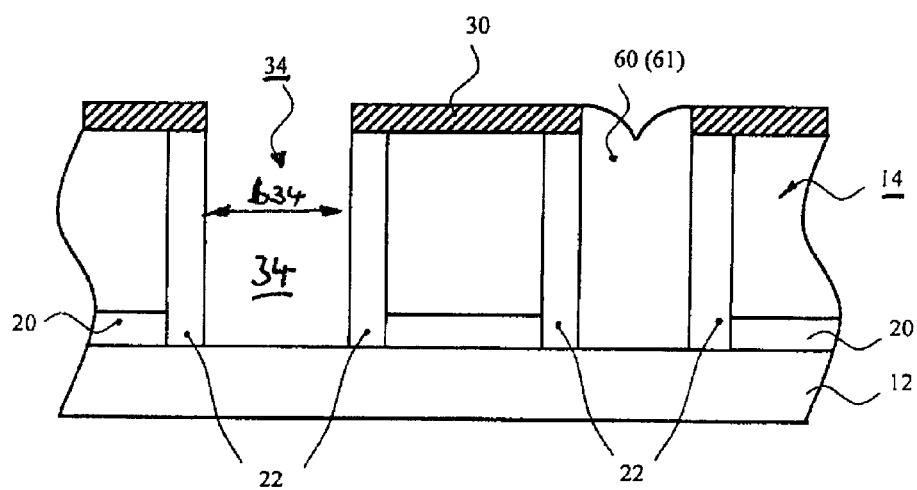

FIG. 6 shows the state which is reached after isotropic etching, for example wet chemical etching or isotropic plasma etching. The doped layer 50 is etched off from the surface and from the bottom as well as from the sidewalls of the wide isolation trench 34. The etching attack in the depth of this trench is made possible by the vertical gap 34a. In the narrow trench 32 which is completely filled the etching attack can be performed only from the surface so that a residue of the doped layer remains in the trench (residue in the meaning of residual layer).

FIG. 7 shows the state after annealing. By this heat treatment the doping atoms diffuse out of the doped layer 60, i.e. the doped residue of the layer 50, into the trench sidewalls. The second sidewall doping 72 is produced in this way. During this process the surface of the wafer is protected by the masking layer 30. In this case the first sidewall doping can be n-conductive as well as p-conductive. The concentration of the second sidewall doping can be raised by an additional doping of the same type, can be lowered by a partial compensation and can be changed with respect to the conductivity type by complete compensation and a compensation going beyond that.

Subsequently the isolation trenches can be filled by means of known methods and leveled (planarized) on the surface.

FIG. 8 shows another embodiment. In this case the material layer is provided as a layer 51 (see FIG. 5) serving as a mask during subsequent processing steps. The residue 61 of the layer 51 remaining in the narrow isolation trench 32 is used only as a masking layer.

For this variation the layer 51 (its residue 61) can be undoped.

The original sidewall doping 22 remains as it is. The open wider trench 34 can be doped by gas phase doping or by ion implantation at a suitable angle as indicated by arrows D1, D2. In this way the sidewall doping 82 is created in the presence of the residual layer 61 (in the other trench).

Thus the isolation trench 32 having a first sidewall doping 22 and the isolation trench 34 having a sidewall doping 82 are present on the wafer. Ion implantation also permits differently doping the sidewalls of the trench 34 with respect to doping substance and concentration when certain shapes and configurations of trenches are formed, for example trenches having straight edges and a rectangular shape.

All dopings may differ with respect to concentration as well as the type of doping substance.

Figure 9:
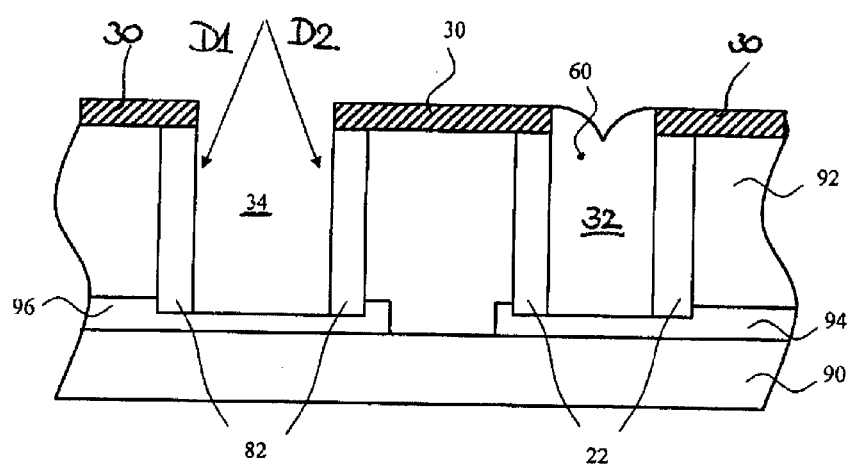
FIG. 9 shows a variation using an epitaxial wafer wherein the epitaxial layer forms a pn junction with the substrate.

FIG. 9 shows another embodiment. In this case, the initial wafer is an epitaxial wafer which consists of a substrate wafer 90 comprising a first doping type, for example p-conductive, and an epitaxial layer 92 comprising a second doping type, for example n-conductive. A buried doped layer 94 of the first doping type, for example p-conductive, and a second buried doped layer 96 of a second doping type, for example n-conductive, were inserted between the substrate wafer 90 and the epitaxial layer 92.

Now the buried doped layer 94 of a first doping type, for example p-conductive, can be contacted or electrically connected, respectively, by means of the first trench sidewall doping 22, for example p-conductive. The second buried doped layer 96 of a second doping type, for example n-conductive, can be contacted or electrically connected, respectively, by means of the third sidewall doping 82, for example n-conductive.

In another embodiment a method for producing isolation trenches having different sidewall dopings on a silicon on insulator (SOI) silicon wafer of the trench-isolated smart power technology is provided, wherein the isolation trenches are used as isolating elements and at the same time the trench sidewalls are used as conductor regions for differently doped buried layers, wherein two types of trenches, which are characterized by a narrow trench, on the one hand, and by a wide trench, on the other hand, are etched to such a depth by means of a photolithographic process using a hard mask which acts at the same time as a diffusion barrier against diffusants, that they penetrate a buried doped layer to terminate on the buried oxide.

Subsequently the sidewalls of the two trenches are doped with a first doping type, wherein doped sidewalls are created. Thereafter a doping layer 50 is deposited with its thickness adapted to the different widths of the trenches in such a way that the narrow trench 32 is filled up to and beyond the hard mask 30, and in the wide trench 34 a gap remains open extending from the surface down into the depth, so that during the subsequent isotropic etching the wide trench 34 is etched open while the narrow trench 32 remains filled with a residue of the layer 60. After annealing the doped sidewalls 72 are formed with a second doping differing from the sidewalls 22 while the surface of the wafer is protected through the masking layer 30 during this process.

In another embodiment a method for producing isolation trenches having different sidewall dopings on a silicon on insulator (SOI) silicon wafer of the trench-isolated smart power technology is provided, wherein the isolation trenches are used as isolating elements and at the same time the trench sidewalls are used as conductor regions for differently doped buried layers, wherein two types of trenches, which are characterized by a narrow trench 32, on the one hand, and by a wide trench 34, on the other hand, are etched to such a depth by means of a photolithographic process using a hard mask 30 which acts at the same time as a diffusion barrier against diffusants, that they penetrate a buried doped layer 20 to terminate on the buried oxide.

Subsequently the sidewalls of the two trenches are doped with a first doping type, wherein the doped sidewalls 22 are created. Thereafter an isolating diffusion barrier layer 51 is deposited with its thickness adapted to the different widths of the trenches in such a way that the narrow trench 32 is filled up to and beyond the hard mask 30, and in the wide trench 34 a gap remains open extending from the surface down into the depth, so that during the subsequent isotropic etching the wide trench 34 is etched open while the narrow trench 32 remains filled with a residual layer of the diffusion barrier layer 61 and, after a further doping, the doped sidewalls 82 are formed with a second doping differing from the sidewalls 22 while the surface of the wafer is protected through the masking layer 30 and the sidewalls of the narrow trench 32 are protected by the layer 61 during this process.

In a further embodiment a method for producing isolation trenches having different sidewall dopings on a silicon on insulator (SOI) silicon wafer of the trench-isolated smart power technology is provided, wherein isolation trenches having straight sides extending in an orientation at identical angles are used as an isolating element and at the same time the trench sidewalls are used as a conductor region for buried, differently doped layers, wherein two types of trenches, which are characterized by a narrower trench 32, on the one hand, and by a wider trench 34, on the other hand, are etched to such a depth by means of a photolithographic process using a hard mask 30 which acts at the same time as a diffusion barrier against diffusants, that they penetrate a buried doped layer 20 to terminate on the buried oxide.

Thereafter the sidewalls of both trenches are doped with a first doping type so that the doped sidewalls 22 are created. Subsequently an isolating diffusion barrier layer 51 (not shown in FIG. 8) is deposited with its thickness adapted to the different widths of the trenches in such a way that the narrow trench 32 is filled up to and beyond the hard mask 30, and in the wide trench 34 a gap remains open extending from the surface down into the depth, so that during a subsequent isotropic etching the wide trench 34 is etched open while the narrow trench 32 remains filled with a residue of the layer 51, and the two sidewalls of the wide trench 34 are provided with a different doping by means of ion implantation and annealing. In this way the doped sidewalls 83 and 84 are formed with a different doping which also differs from the doping of the sidewalls 22. During this process, the surface of the wafer is protected by the masking layer 30 and the sidewalls of the narrow trench 32 are protected by the residue 61 of the layer 51.

In another embodiment a method for producing isolation trenches having different sidewall dopings on an epitaxial wafer is provided, which wafer consists of a substrate wafer 90 comprising a doping of the first conductor type and an epitaxial layer 92 comprising a doping of the second conductor type in the trench-isolated smart power technology, wherein the isolation trenches are used as isolating elements and at the same times the trench sidewalls are used as conductor regions for buried, differently doped layers, wherein a first buried doped layer 94 of the first conductor type and a second buried doped layer 96 of the second conductor type are introduced without contacting each other in the same depth between the substrate wafer 90 and the epitaxial layer 92.

Thereafter two types of trenches, which are characterized by a narrow trench 32, on the one hand, and by a wide trench 34, on the other hand, are etched to such a depth by means of a photolithographic process using a hard mask 30 which acts at the same time as a diffusion barrier against diffusants, that the narrow trench 32 terminates in the buried doped layer 94 of the first conductor type and the wide trench 34 terminates in the buried doped layer of the second conductor type.

Subsequently the first trench sidewall doping 22 of the first conductor type follows so that the doped layer 94 of the first conductor type is contacted or electrically connected, respectively, and then the sidewall doping 82 of the second conductivity type is performed using the diffusion barrier layer 61, so that the second buried doped layer 96 of the second conductivity type is contacted or electrically connected, respectively.

The invention claimed is:

1. A method for producing isolation trenches having different sidewall dopings on a silicon-based substrate wafer for use in a trench-isolated smart power technology, the method comprising:
   forming a first trench having a first width and a second trench having a second width that is larger than the first width using a hard mask, the first trench and the second trench having sidewalls;
   first doping the sidewalls of the first and the second trenches using a first doping to produce sidewalls of a first doping;
   depositing a material layer having a given thickness which is selected such that the first trench is filled completely up to and beyond the hard mask and that a gap remains in the second trench;
   isotropic etching of the material layer, thereby removing the material layer from the second trench while keeping a residue of the material layer in the first trench;
   performing a further doping of the sidewalls of one of the first trench and the second trench in the presence of the residue of the material layer in the first trench.

2. The method according to claim 1, wherein the material layer is deposited as a doping layer, and wherein the step of performing the further doping of sidewalls of one of the first trench and the second trench in the presence of the residue of the material layer comprises: performing annealing for forming a second doping in the sidewalls of the first trench.

3. The method according to claim 1, wherein the material layer is deposited as a diffusion barrier layer, and wherein the step of performing the further doping of sidewalls of one of the first trench and the second trench in the presence of the residue of the material layer comprises: performing another doping for producing doped sidewalls in the second trench differing from the first doping of the sidewalls.

4. The method according to claim 1, wherein the step of performing the further comprises: performing an ion implantation for producing one of first doped sidewalls and second doped sidewalls in the second trench, differing from the first doping of the sidewalls of the first trench, wherein the residue of the material layer is used as an implantation mask in the first trench.

5. The method according to claim 1, wherein the substrate wafer is provided as an (SOI) wafer.

6. The method according to claim 5, wherein the first trench and the second trench are etched to such a depth that they penetrate a buried doped layer to terminate on a buried oxide of the (SOI) wafer.

7. The method according to claim 1, wherein the substrate wafer is provided as a silicon substrate wafer comprising a doping of the first conductivity type and a silicon epitaxial layer with a doping of the second conductivity type.

8. The method according to claim 7, wherein a first buried layer with the first conductivity type and separate therefrom a second buried layer with the second conductivity type are provided in the silicon substrate wafer.

9. The method according to claim 8, wherein the first and the second buried doped layer are provided in the same depth, measured from the surface of the silicon epitaxial layer.

10. The method according to claim 8, wherein the first trench and the second trench are etched to such a depth that the first trench terminates in the first buried layer and the second trench terminates in the second buried layer.

11. The method according to claim 1, wherein the hard mask acts as a diffusion barrier against diffusants.

12. A method for producing isolation trenches with different sidewall dopings on a silicon on insulator (SOI) silicon wafer of the trench-isolated smart power technology, wherein the SOI comprises a buried doped layer on a buried oxide layer and isolation trenches are provided as isolating elements and at the same time isolation trench sidewalls are used as a conductor region for buried, differently doped layers, the method comprising:
  etching a narrower trench and a wider trench with a photolithographic process using a hard mask also acting as a diffusion barrier against diffusants, the etched trenches penetrating the buried doped layer to terminate on the buried oxide layer,
  first doping the sidewalls of the narrower trench and the wider trench with a first doping type so that the first doped sidewalls are created,
  depositing a doping layer having a thickness adapted to the different widths of the narrower and wider trenches in such a way that the narrower trench is filled up to and beyond the hard mask, and in the wider trench a gap remains open and extends from a surface downwards, so that during a subsequent isotropic etching the wider trench is etched open while the narrower trench remains filled with a residue of the doping layer and, after an annealing step, the first doped sidewalls of the narrower trench are provided with a second doping type differing from the first doping type while the surface of the wafer is protected by the masking layer.

13. A method for producing isolation trenches with different sidewall dopings on a silicon on insulator (SOI) silicon wafer of the trench-isolated smart power technology, wherein the SOI comprises a buried doped layer on a buried oxide layer and isolation trenches are used as isolating element and at the same time trench sidewalls of the isolation trenches are used as conductor regions for buried, differently doped layers, the method comprising:
  etching a narrow trench and a wide trench to such a depth by means of a photolithographic process using a hard mask which acts as a diffusion barrier against diffusants of the etched trenches penetrating the buried doped layer to terminate on the buried oxide,
  first doping the sidewalls of the narrow trench and a wide trench with a first doping type so that first doped sidewalls are created,
  depositing an isolating diffusion barrier layer having a thickness adapted to different widths of the wide and narrow trenches in such a way that the narrow trench is filled up to and beyond the hard mask, and the wide trench having a gap remaining open and extending from the surface downward so that during a subsequent isotropic etching the wide trench is etched open while the narrow trench remains filled with a residue layer of the diffusion barrier layer and,
  second doping the first doped sidewalls with a second doping type differing from the first type while the surface of the wafer is protected by the masking layer and the sidewalls of the narrow trench are protected by the residue of the diffusion barrier layer during the second doping.

14. The method of claim 13, further comprising forming straight sides of the isolation trenches, the sides extending in an orientation having the same angles as isolating elements and the trench sidewalls are conductor regions.

15. A method for producing isolation trenches having different sidewall dopings on a silicon on insulator (SOI) silicon wafer of the trench-isolated smart power technology, wherein the SOI comprises a buried doped layer on a buried oxide layer and isolation trenches having straight sides extending in an orientation at identical angles are used as isolating elements and at the same time trench sidewalls are used as a conductor region for buried, differently doped layers, wherein two types of trenches, the method comprising:
  etching a narrow trench and a wide trench to a depth by means of a photolithographic process using a hard mask which acts at the same time as a diffusion barrier against diffusants, the etched trenches penetrating a buried doped layer to terminate on the buried oxide,
  first doping sidewalls of the narrow trench and the wide trench with a first doping type so that the first doped sidewalls are created,
  depositing an isolating diffusion barrier layer having a thickness adapted to the different widths of the trenches in such a way that the narrow trench is filled up to and beyond the hard mask, and the wide trench having a gap remains open and extending downward so that during a subsequent isotropic etching the wide trench is etched open while the narrow trench remains filled with a residue layer of the deposited barrier layer, and two sidewalls of the wide trench are provided with a different doping by ion implantation and annealing;
  wherein a surface of the wafer is protected by the masking layer and the sidewalls of the narrow trench are protected by the residue layer.

16. A method for producing isolation trenches having different sidewall dopings on an epitaxial wafer, the wafer having a substrate wafer comprising a doping of the first conductor type and an epitaxial layer comprising a doping of the second conductor type in the trench-isolated smart power technology, wherein the isolation trenches are used as isolating elements and at the same times trench sidewalls are used as conductor regions for buried, differently doped layers, the method comprising:
  introducing a first buried doped layer of the first conductor type and a second buried doped layer of the second conductor type in the same depth between the substrate wafer and the epitaxial layer without contacting one another,
  etching a narrow trench and a wide trench by a photolithographic process using a hard mask, the narrower trench terminating in the first buried doped layer of the first conductor type and the wider trench terminating in the second buried doped layer of the second conductor type,
  doping trench sidewalls of the narrow trench with a first conductor type so that the first buried doped layer of the first conductor type is contacted and electrically connected and doping trench sidewalls of the wide trench with a of the second conductor type in the presence of a diffusion barrier layer in the narrow trench, so that the second buried doped layer of the second conductor type is electrically connected.

* * * * *

UNITED STATES PATENT AND TRADEMARK OFFICE
CERTIFICATE OF CORRECTION

| | | |
|---|---|---|
| PATENT NO. | : 8,278,183 B2 | Page 1 of 1 |
| APPLICATION NO. | : 12/670771 | |
| DATED | : October 2, 2012 | |
| INVENTOR(S) | : Ralf Lerner | |

It is certified that error appears in the above-identified patent and that said Letters Patent is hereby corrected as shown below:

On Title Page please correct as follows:

(86) PCT No.:  PCT/EP2008/059835

Signed and Sealed this
Sixth Day of November, 2012

David J. Kappos
*Director of the United States Patent and Trademark Office*